United States Patent [19]

Morohashi

[11] Patent Number: 5,079,221
[45] Date of Patent: Jan. 7, 1992

[54] SUPERCONDUCTOR PASSIVATED BY AN ORGANIC FILM AND A METHOD FOR FORMING THE ORGANIC FILM

[75] Inventor: Shi'ichi Morohashi, Atsugi, Japan

[73] Assignee: Fujitsu Limited, Kawasaki, Japan

[21] Appl. No.: 313,767

[22] Filed: Feb. 22, 1989

[30] Foreign Application Priority Data

Feb. 23, 1988 [JP] Japan .................. 63-040079
Sep. 29, 1988 [JP] Japan .................. 63-245204
Jan. 20, 1989 [JP] Japan .................. 1-12415

[51] Int. Cl.$^5$ .............................. B32B 9/00
[52] U.S. Cl. ........................... 505/1; 505/701; 505/702; 505/703; 505/704; 428/426; 428/522; 428/688; 428/901; 428/930
[58] Field of Search ................ 505/1, 701–704; 428/426, 522, 688, 901, 930

[56] References Cited

U.S. PATENT DOCUMENTS

4,871,316 10/1989 Herrell et al. .................. 439/66
4,888,203 12/1989 Rothchild et al. ............... 505/1

FOREIGN PATENT DOCUMENTS

287325 10/1988 European Pat. Off. .

OTHER PUBLICATIONS

Water Interaction with the Superconducting YBa$_2$Cu$_3$O$_7$ Phase, Yan et al., Appl. Phys. Lett. 51(7), 8/87.
Plasma Polymerization for High T$_c$ Oxide Superconductors, Fujitsu Ltd. 1988.
Applied Physics Letters, vol. 52, No. 22, May 30, 1988, pp. 1897–1898.
Denshi John Tsushin Gakkai Gijutsu Kenkyu Hokoku, vol. 88, No. 146, 1988, pp. 19–22.
Japanese Journal of Applied Physics, vol. 27, No. 11, Nov., 1988, pp. L2088–L2090.
Applied Physics Letter, vol. 51, No. 7, Aug. 1987, pp. 532–534.
Applied Physics Letter, vol. 52, No. 1, Jan. 4, 1988, pp. 69–71.

*Primary Examiner*—Patrick J. Ryan
*Attorney, Agent, or Firm*—Armstrong, Nikaido, Marmelstein, Kubovcik & Murray

[57] ABSTRACT

A ceramic superconductor layer formed on a substrate is passivated by a plasma polymerized film formed on a surface of the ceramic superconductor layer so as to have a thickness of 0.5 to 100 nm, by a conventional plasma discharging method using an organic gas such as trifluoromethane gas. According to spectroscopic analysis, the plasma polymerized film includes fluorocarbon bonds or groupings, and further, bonding between fluorine and yttrium, barium and copper is observed at the interface between the ceramic superconductor layer and the plasma polymerized film. An electronic minute device including the ceramic superconductor layer is fabricated by conventional patterning of the ceramic superconductor layer passivated by the plasma polymerized film.

5 Claims, 13 Drawing Sheets

SUPERCONDUCTOR PASSIVATED BY AN ORGANIC FILM AND A METHOD FOR FORMING THE ORGANIC FILM

BACKGROUND OF THE INVENTION

The present invention relates to a superconductor passivated by an organic film and to a method of forming the organic film on a surface of the superconductor. The organic film prevents deterioration of the superconduction property of the superconductor caused by annealing in air and soaking in water.

Generally, a superconductor has the following nature in a fabrication process of the superconductor: the Tc value has a proper value at the beginning of the fabrication, however, as time goes by, the property of the superconductor deteriorates so that the Tc value decreases and the electrical resistivity increases. This has been a problem in practical use, and above all the superconductivity is greatly affected by annealing in air and/or soaking in water so as to be lowered. Particularly, when the superconductor is formed into a thin layer for application to a microelectronic device such as a Josephson junction device, a Superconducting Quantum Interference Device (SQUID) and a hybrid device combining the superconductor and a semiconductor, the problem due to humidity and/or annealing in air and soaking in water becomes an obstacle for fabricating the minute electrical device.

Therefore, an object of the present invention is to improve a superconductor so that the superconductor is less influenced by the humidity around the superconductor and/or the temperature of the superconductor even with the passage of time.

Another object of the present invention is to increase the life of products comprised of a superconductor.

Still another object of the present invention is to increase the reliability of a superconductor.

Yet another object of the present invention is to improve a fabrication process of a minute electrical device comprised of a superconductor so as to be performed easily and at low cost.

SUMMARY OF THE INVENTION

The above objects are accomplished by passivating a superconductor by using an organic film formed on the surface of the superconductor. The passivation organic film has bonds containing carbon (C) and fluorine (F), such as difluorocarbon ($CF_2$), trifluorocarbon ($CF_3$) and monofluorocarbon (CF) bonds. The passivation organic film is a polymerized film formed on the surface of the superconductor by a plasma discharging method performed by setting the superconductor in a plasma chamber and supplying fluoride compound gases thereinto. The fluoride compound gases are compounds such as fluoroolefins such as fluoromethane ($CH_{4-x}F_x$), fluoroethane ($C_2H_{6-x}F_x$), tetrafluoroethylene ($C_2F_4$) or hexafluoropropylene ($C_3F_6$) and aromatic fluorohydrocarbons such as vinylidene fluoride ($CH_2CF_2$), vinyl fluoride ($CH_2CHF$) or benzotrifluoride ($C_6H_5CF_3$). Therefore, the passivation organic film is called the "plasma polymerized film" here.

The plasma polymerized film is formed on the superconductor and protects the superconductor from deterioration caused by annealing in air and soaking in water, so that the superconductivity property can be maintained and not deteriorated with passage of time. Applying the plasma polymerized film to the surface of the superconductor, the water-resisting and the heat-resisting property of the superconductor can be kept to a value established at an initial time of fabrication. In other words, the problem of decreasing Tc value and/or increasing resistivity of the superconductor can be improved. Therefore, when the superconductor passivated by the plasma polymerized film is fabricated to a thin layer and applied to a minute electrical device such as a Josephson junction device, the minute electrical device can be easily fabricated, for example, by performing patterning, using an organic solvent such as acetone, an acid such as nitric acid and hydrofluoric acid and water.

The deteriorated superconductivity of the superconductor due to the passage of time can be recovered to approximately the initial state by supplying an oxygen gas and mixing with the fluoride compound gases when the plasma polymerized film is formed in the plasma chamber.

DESCRIPTION OF THE PREFERRED EMBODIMENTS

As is well known, a superconductor has a critical temperature (Tc) below which the superconductor exhibits a superconduction phenomenon. Previously, when the Tc value of the superconductor was low, for example, at a temperature of liquid helium, it was hard to put the superconductor to practical use. However, recently, the Tc value has been raised tremendously high because of world-wide studies of materials for superconductors. For instance, the Tc value of a superconductor using a material belonging to a Lanthanum-Strontium-Copper Oxide (LaSrCuO$_x$) group is 40K, that belonging to a Yttrium-Barium-Copper Oxide (YBaCuO$_x$) group is 90K and that belonging to a Bismuth-Strontium-Calcium-Copper Oxide (BiSrCaCuO$_x$) group is 105K. The superconductors made of these high Tc materials are generally called "high Tc superconductors", and as seen from the above materials, the high Tc superconductors are "ceramic superconductors". Thus, the superconductors have not been of practical use until the ceramic superconductor was developed. Therefore, in the embodiments of the present invention, the ceramic superconductors will be discussed.

The ceramic superconductor is easily fabricated to a bulk or a thin layer. The bulk is fabricated by a conventional rubber press method, and the thin layer is formed onto a substrate made of a single crystal such as Strontium-Titanium Oxide (SrTiO$_3$), Aluminum Oxide (sapphire-Al$_2$O$_3$) or Magnesium Oxide (MgO), by an Electron Beam (EB) evaporating method, a sputtering method or a Molecular Beam Epitaxial (MBE) method. The superconductor fabricated into a thin layer is of most practical use now and is applied to minute electrical devices, so that in the embodiments of the present invention, the thin layer ceramic superconductor will be discussed.

In the present invention, a polymerized organic film fabricated by a plasma discharging method is used as a passivation film for preventing deterioration of the superconduction property of the superconductor during the passage of time because of humidity. Therefore, in the following embodiments, the plasma polymerized organic film, which will be simply called the "plasma polymerized film", formed on the ceramic superconductor fabricated into a thin layer will be discussed in reference to FIGS. 1 to 13.

Figure 1:
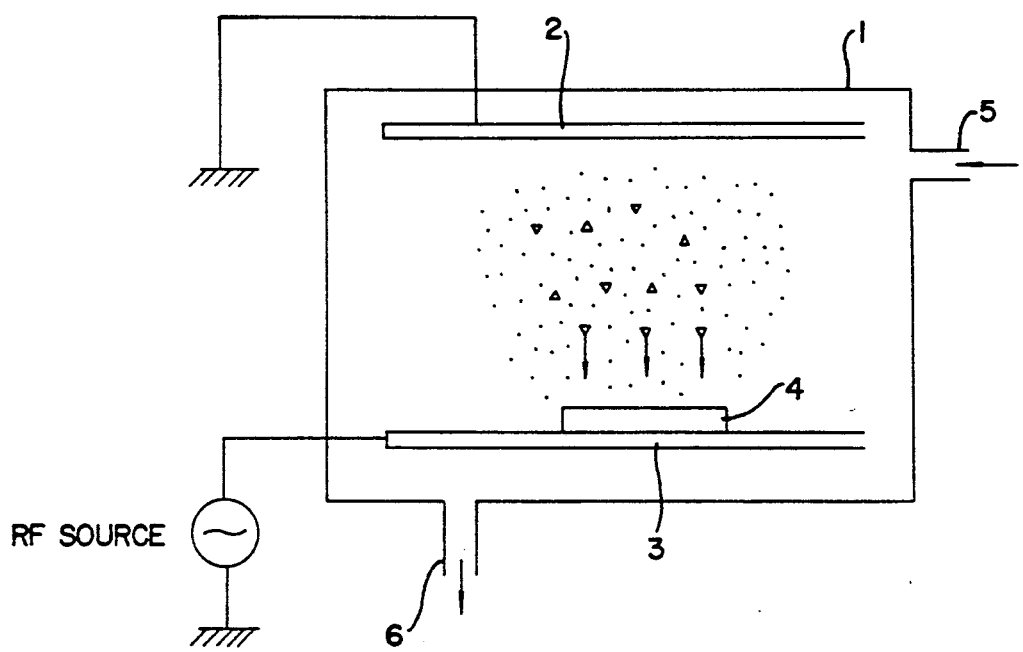
FIG. 1 is a schematic drawing of a parallel plate type plasma generating apparatus.

As the first embodiment, a plasma polymerized film passivated on a ceramic superconductor YBaCuO$_x$ and a method of forming the plasma polymerized film will be discussed with reference to FIG. 1. FIG. 1 shows a schematic drawing of a parallel plate type plasma generating apparatus for forming the plasma polymerized film on the ceramic superconductor. In FIG. 1, a chamber 1 is evacuated by a vacuum pump, which is not depicted in FIG. 1, to an order of 1.33 Pascal (Pa). A source gas for the plasma discharging is supplied to the chamber 1 through a gas inlet 5 and exhausted through a gas outlet 6 attached to the chamber 1. A pair of plate electrodes 2 and 3, each having a 300 cm$^2$ surface area, are arranged in the chamber 1, and radio frequency (RF) power is applied from an RF source to the plate electrode 3, while grounding the plate electrode 2. Then, plasma is generated in the region provided between the plate electrodes 2 and 3. A sample 4 composed of an insulating substrate 7 and a ceramic superconductor 8 (see FIG. 2) made of YBaCuO$_x$ in a thin layer formed on the surface of the insulating substrate 7 is placed on the plate electrode 3. The insulating substrate 7 is generally made of material such as SrTiO$_3$, Al$_2$O$_3$ or MgO, and is made of SrTiO$_3$ in the first embodiment.

Figure 2:
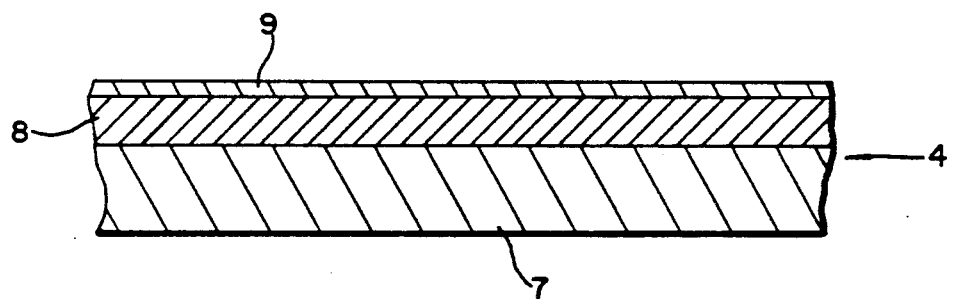
FIG. 2 is a schematic cross-sectional view of a sample consisting of a substrate, a superconductor film and a plasma polymerized film.

In order to form a plasma polymerized film 9 on the ceramic superconductor 8 as shown in FIG. 2, trifluoromethane (CHF$_3$), being a kind of fluoromethane, is used as the source gas under a pressure of between 13.3 to 199.5 Pascal (Pa), and RF power less than 0.64 W/cm$^2$ is applied for 10 minutes. The period of applying the RF power, 10 minutes here, is generally called a discharging time. Then a plasma polymerized film 9 is formed on the surface of the ceramic superconductor 8 so as to have a thickness of 10 to 50 nm by controlling the RF power, the discharging time and/or the pressure of the source gas.

The ceramic superconductor passivated by the plasma polymerized film by using the plasma discharging apparatus as mentioned above was examined in comparison with the usual ceramic superconductor not passivated by the plasma polymerized film for confirming the merit of the plasma polymerized film. That is, the superconductivity of the ceramic superconductor passivated by the plasma polymerized film, the composition of the plasma polymerized film and the passivation effect of the plasma polymerized film were measured or confirmed, and the following results were obtained, wherein the formation of the plasma polymerized film will be simply called the "plasma treatment", the ceramic superconductor passivated by the plasma polymerized film will be simply called the "film coated ceramic superconductor" and the ceramic superconductor not passivated by the plasma polymerized film will be simply called the "film uncoated ceramic superconductor" hereinafter.

First, the superconduction property of the film coated ceramic superconductor is as follows: the Tc value is nearly constantly 80K before and after the plasma treatment independent of the pressure of the CHF$_3$ source gas; and the resistivity ratio, at 20° C., of the film coated ceramic superconductor to the film uncoated ceramic superconductor is on at 66.5 Pa and 199.5 Pa pressure points of the source gas and is slightly larger than one at 26.6 Pa and 133 Pa pressure points of the source gas.

Figure 3:
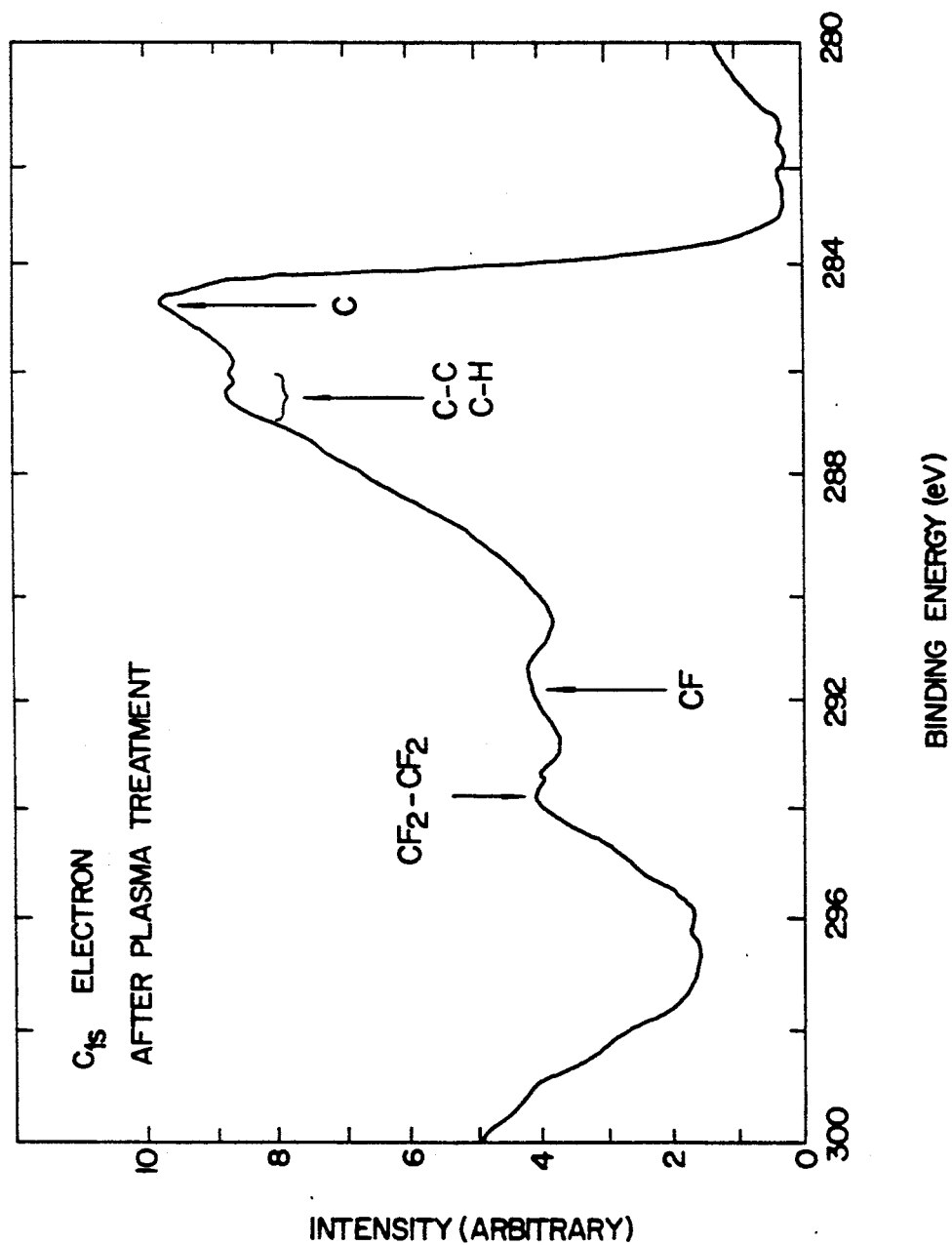
FIG. 3 is the XPS spectrum of $C_{1s}$ electron in a plasma polymerized film formed on a $YBaCuO_x$ superconductor.

Second, the composition, analyzed by spectroscopic means, of the plasma polymerized film is as shown in FIGS. 3 to 6. That is:

FIG. 3 shows a spectrum of the plasma polymerized film obtained by x-ray photoelectron spectroscopy (XPS). In FIG. 3, the relative intensity of emission of carbon 1s electron ($C_{1s}$) is plotted against its binding energy. From the spectrum in FIG. 3, it can be analyzed that the spectral peaks indicated by the four arrows in FIG. 3 represent a fact that $CF_2$—$CF_2$, C—F, C—C and C—H bonds and free carbon exist in the plasma polymerized film.

Figure 4:
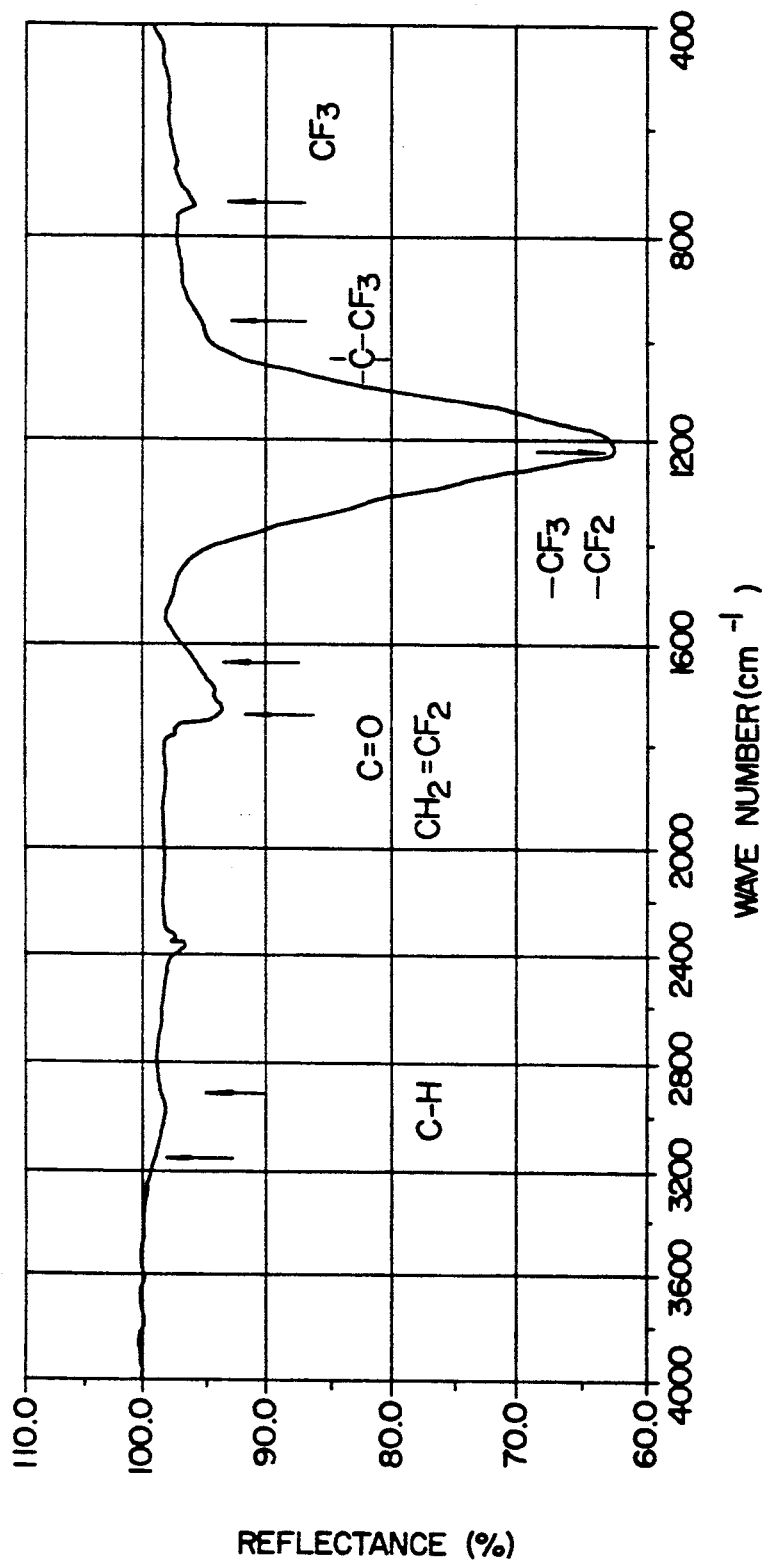
FIG. 4 is the infrared reflection spectra of a plasma polymerized film formed on an Si substrate.

FIG. 4 shows an infrared reflection spectrum of the plasma polymerized film formed on a silicon substrate instead of the $SrTiO_3$ substrate. In FIG. 4, the reflectance of the film is plotted against wavenumber, and from FIG. 4, it can be analyzed that the spectral signals indicated by arrows in FIG. 4 represent a fact that C—H, C═O, $CH_2$═$CF_2$, C—F, $CF_3$ and C—$CF_3$ bonds exist in the plasma polymerized film. Of these bonds, C═O and C—H bonds are not important, because the C═O and C—H bonds are produced only in a process of reaction occurring between C in the plasma polymerized film and O in the air or C in the plasma polymerized film and H in the air after the plasma polymerized film is formed.

From FIGS. 3 and 4, it is confirmed that the plasma polymerized film includes at least the monofluorocarbon bond, the difluorocarbon bond and the trifluorocarbon bond.

Figure 5:
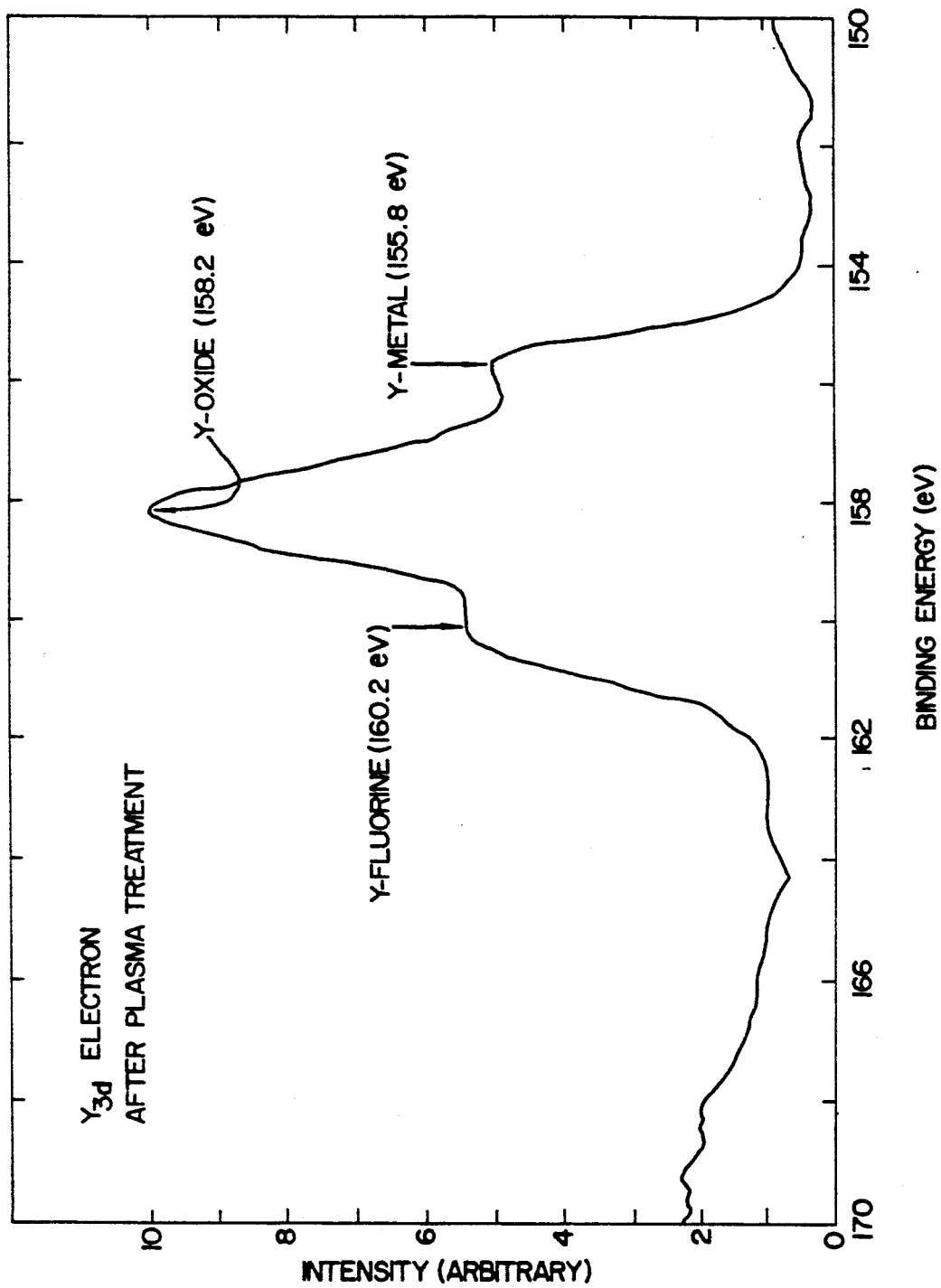
FIG. 5 is the XPS spectrum of $Y_{3d}$ electron at the interface between the plasma polymerized film and a $YBaCuO_x$ superconductor.
Figure 6:
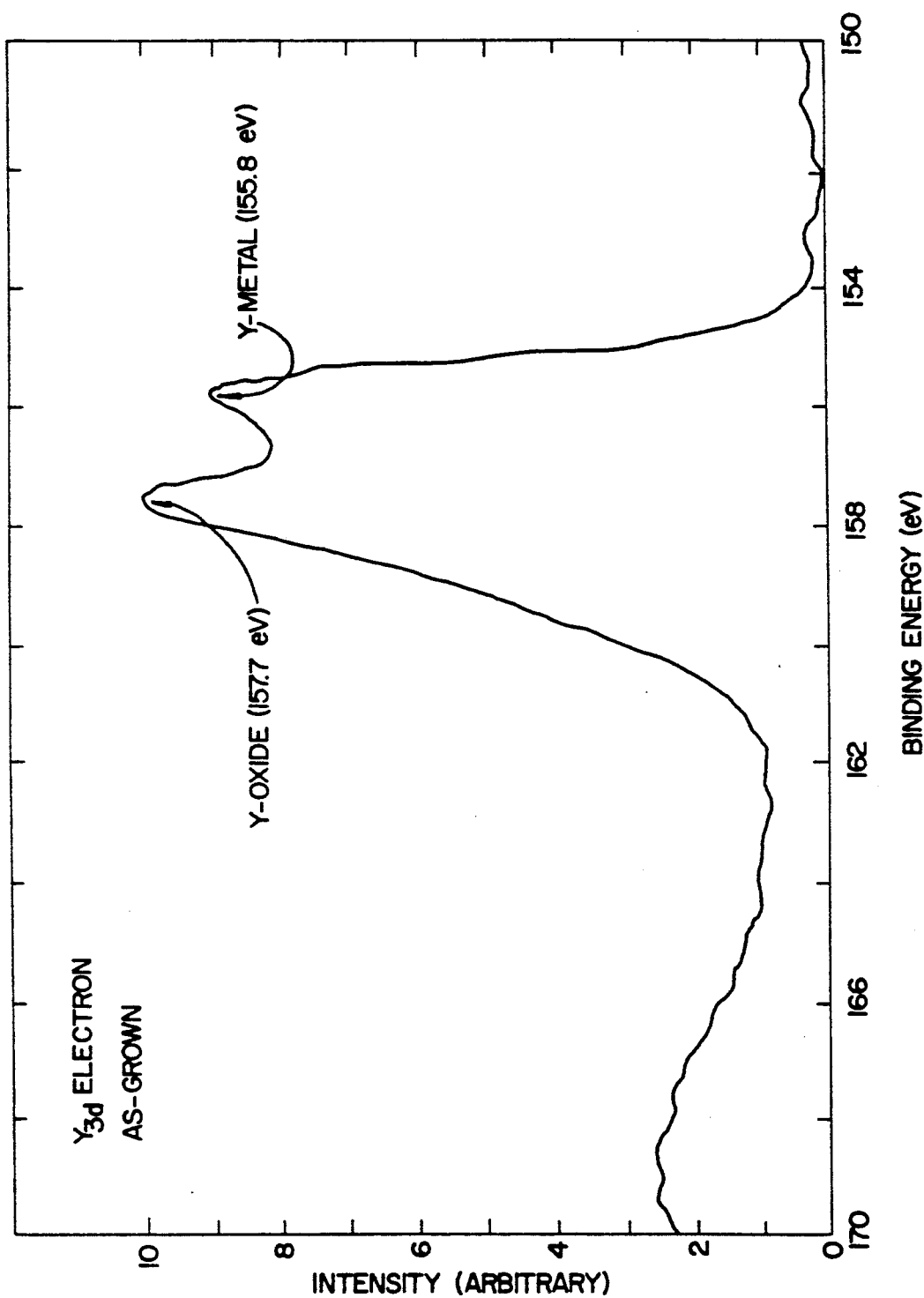
FIG. 6 is the XPS spectrum of $Y_{3d}$ electron at a surface of an as-grown $YBaCuO_x$ superconductor.

The chemical property of the interface region between the plasma polymerized film and the ceramic superconductor is analyzed by XPS as shown in FIGS. 5 and 6. The relative intensity of emission from 3d electron of yttrium ($Y_{3d}$) is plotted against its binding energy in FIGS. 5 and 6 in the cases of analyzing the film coated ceramic superconductor and the film uncoated ceramic superconductor respectively. Investigating the spectra in FIGS. 5 and 6, it can be seen that an extra spectral peak due to yttrium-fluorine bond (Y—F) exists at 160.2 eV and two other spectral peaks due to yttrium metal and yttrium oxide exist in FIG. 5 and these other spectral peaks appear in both FIGS. 5 and 6. Although there are no data in FIGS. 5 and 6, the existence of a Ba—F bond and Cu—F bond in the interface region is confirmed by comparing the spectra of the film coated and uncoated ceramic superconductors. From the fact that there are Y—F, Ba—F and Cu—F bonds at the interface region, it can be concluded that the chemical reaction between the source gas and the ceramic superconductor ($YBaCuO_x$) takes place sufficiently even at the beginning of the plasma discharging. This means that the plasma polymerized film is tightly coated on the surface of the ceramic superconductor.

Figure 7:
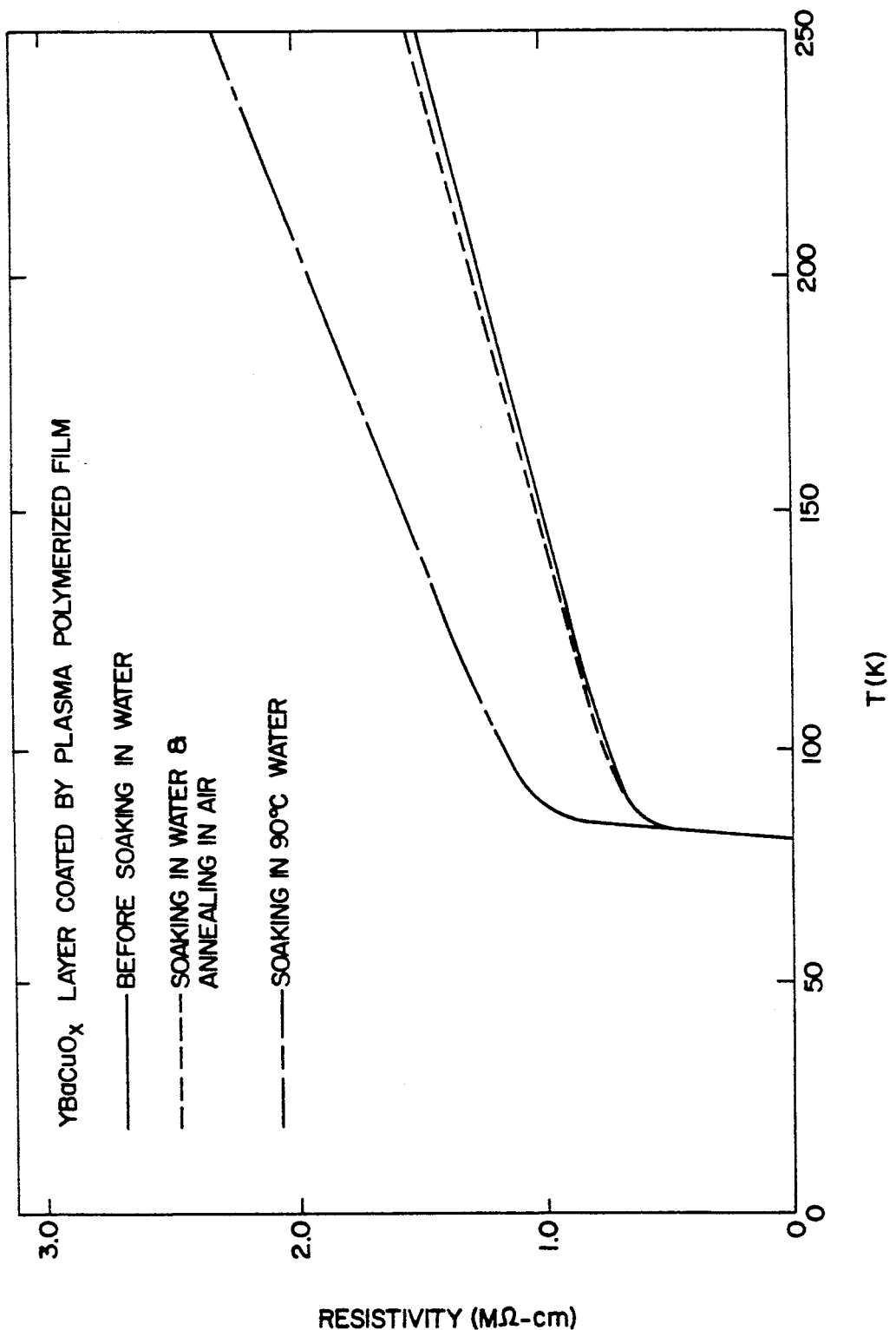
FIG. 7 is a graph showing the temperature dependence of the resistivity of a coated $YBaCuO_x$ superconductor, under three conditions.

Third, the passivation effect of the plasma polymerized film for preventing deterioration, due to annealing in air and/or soaking in water, of the superconductivity of the ceramic superconductor is confirmed by measuring the resistivity of the ceramic superconductor, comparing the film coated ceramic superconductor with the film uncoated one. The confirmation is done from the data shown in FIGS. 7 to 11, as follows:

FIG. 7 shows the relationship between the resistivity and the temperature of the film coated ceramic superconductor, measured under several conditions. In FIG. 7, the solid curve indicates the resistivity, depending on the temperature, of the film coated ceramic superconductor. From the solid curve, it is found that a temperature at the cross point of the solid curve and the abscissa is the Tc value which is 80K in FIG. 7. The dotted curve indicates also the resistivity of the film coated ceramic superconductor. However, in this case, the film coated ceramic superconductor has been initially soaked in water at 20° C. then put in the air at 200° C. for 30 minutes for examining the deterioration of the superconductivity due to the annealing in air and/or soaking in water. Comparing the solid curve with the dotted curve, it can be seen that the Tc value and the resistivity of these curves are almost the same respectively. After the measurement of resistivity, the same sample is soaked again in 90° C. water for 10 min and taken out in air at 200° C. for 30 min, then the resistivity of the film coated superconductor layer is measured. The result of the measurement is shown by a dot-dash-curve. From the dot-dash-curve, it can be seen that the Tc value does not change even though the resistivity increases approximately 50%.

Figure 8:
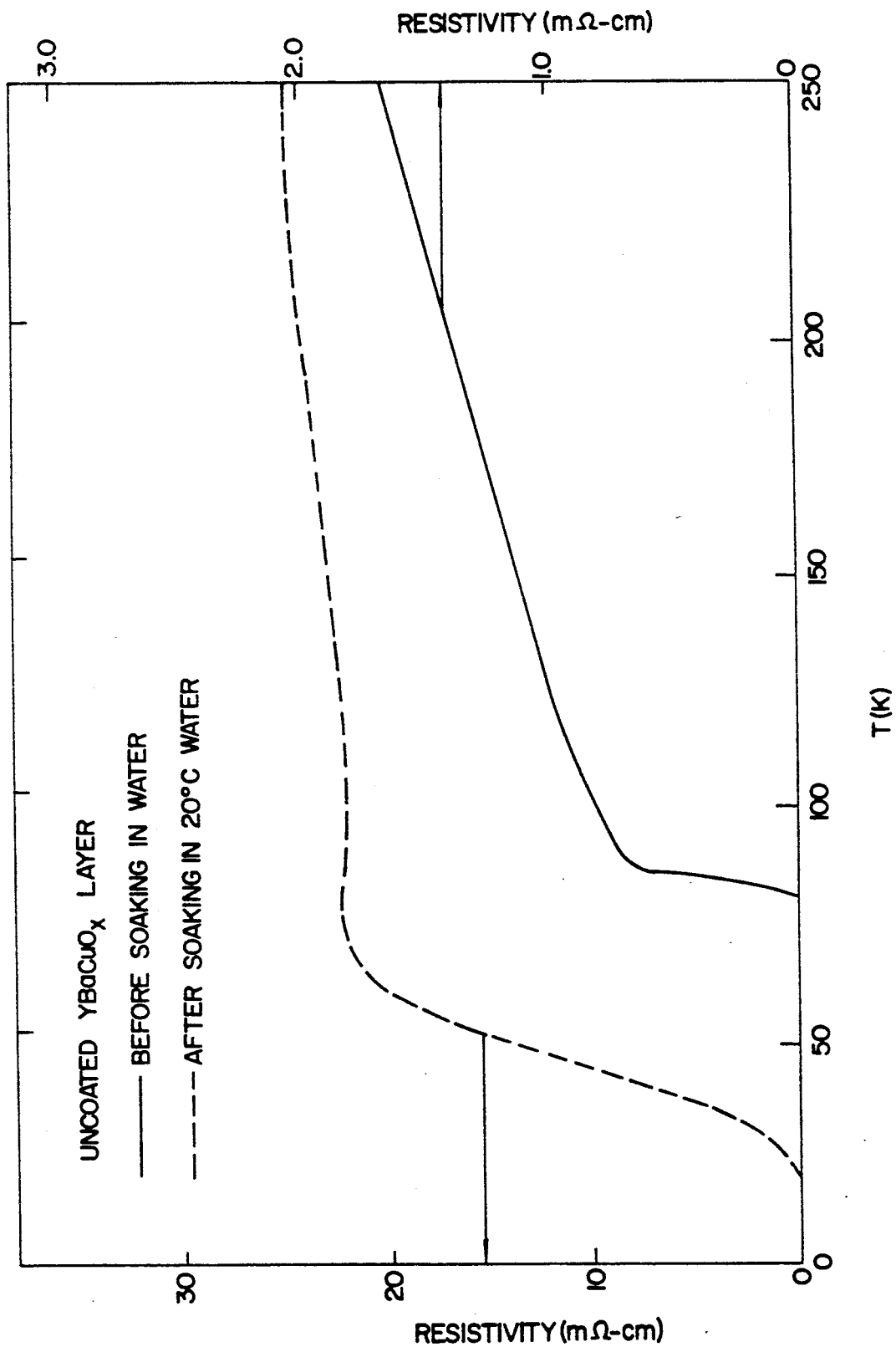
FIG. 8 is a graph showing the temperature dependence of the resistivity of an uncoated $YBaCuO_x$ superconductor before and after soaking in water.
Figure 9:
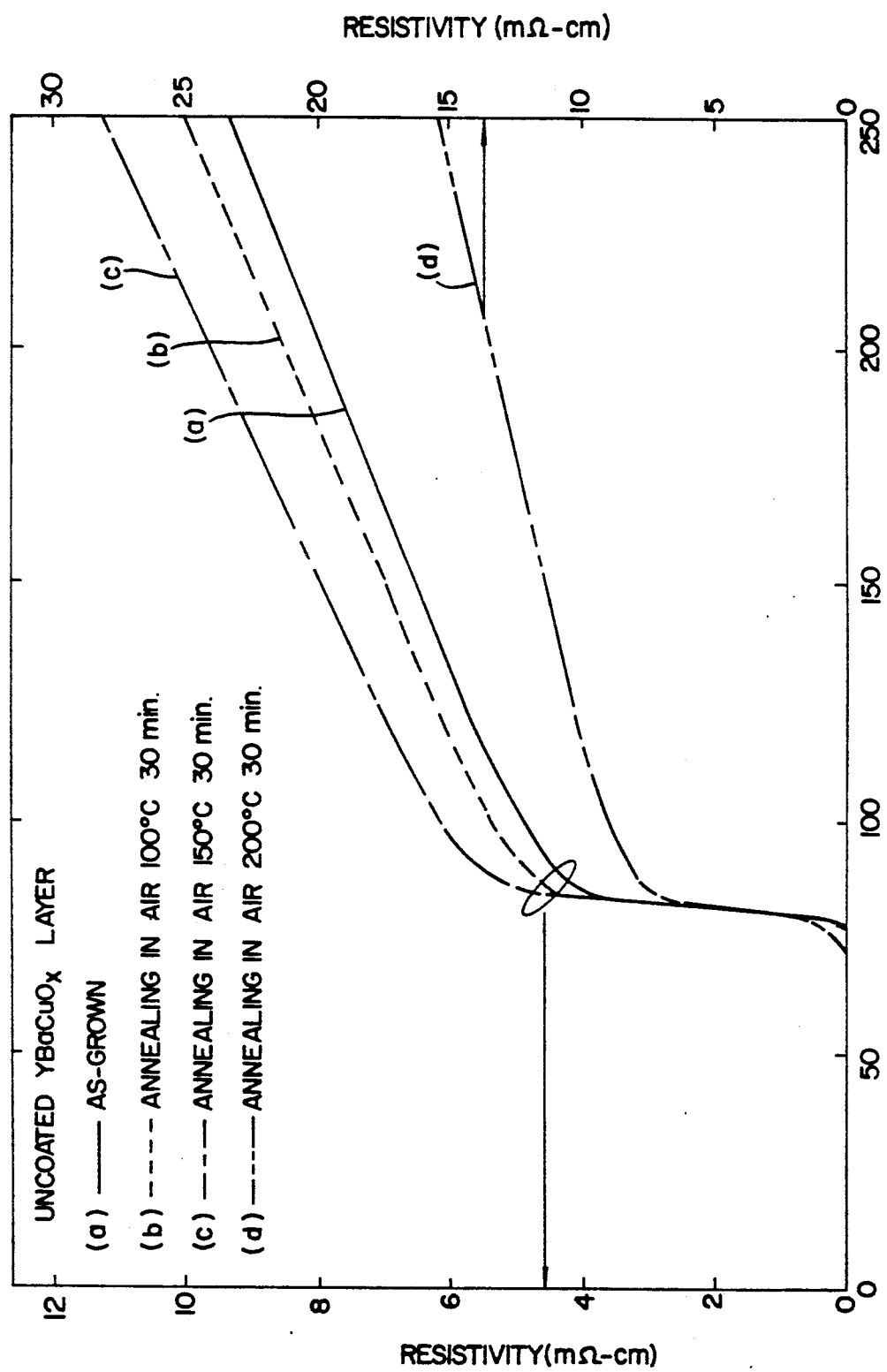
FIG. 9 is a graph showing the temperature dependence of the resistivity of an uncoated $YBaCuO_x$ superconductor under different heat treatment.

The relationship between the resistivity, measured under several conditions, and the temperature of the film uncoated ceramic superconductor is shown in FIGS. 8 and 9. FIG. 8 is for investigating the influence of humidity on the resistivity of the film uncoated ceramic superconductor and FIG. 9 is for investigating the influence of the annealing in air and soaking in water on the resistivity of the film uncoated ceramic superconductor.

In FIG. 8, the solid curve shows the resistivity of the film uncoated ceramic superconductor before soaking in water and the dotted curve shows the resistivity after soaking in water at 20° C. for 60 minutes. Comparing the solid curve with the dotted curve, it can be seen that the respective Tc values are quite different from each other. In the case of the solid curve, the Tc value is 80K. However, in the case of the dotted curve, the Tc value is 17K, from which it can be concluded that the Tc value of the film uncoated ceramic superconductor is easily affected by humidity.

In FIG. 9, the deterioration, due to annealing in air, of the resistivity of the film uncoated ceramic superconductor is examined. In FIG. 9, the curve (a) shown by the solid curve is the resistivity of an as-grown film uncoated ceramic superconductor having a Tc value of 79K. The curve (b) shown by the dotted curve is the resistivity of the film uncoated ceramic superconductor after having been heated in the air at 100° C. for 30 minutes. The curve (c) shown by the dot-dash-curve is the resistivity after having been heated in the air at 150° C. for 30 min. The resistivity for curves (a), (b) and (c) is expressed by the scale on the left hand side. The curve (d) shown by the two dots-dash-curve is the resistivity after having been heated in the air at 200° C. for 30 minutes, and in this case, the resistivity is expressed by the scale on the right hand side.

From FIG. 9, it can be seen that when the film uncoated ceramic superconductor is heated, the resistivity of the film uncoated ceramic superconductor increases two or three times the resistivity of the as-grown film uncoated ceramic superconductor and the $T_c$ value decreases several degrees.

From the first embodiment described above in reference to FIGS. 7, 8 and 9, it is obvious that the plasma polymerized film has a great advantage for preventing deterioration, due to annealing in air and/or soaking in water, of the superconductivity of the ceramic superconductor.

The plasma polymerized film used in the first embodiment can be used also for passivating a ceramic superconductor made of $YBaCuO_x$. The second embodiment of the present invention is concerned with a plasma polymerized film for passivating the ceramic superconductor which will be called the "BiSrCaCuO$_x$ superconductor" hereinafter for distinguishing the ceramic superconductor used in this second embodiment from the ceramic superconductor, made of YBaCuO$_x$, used in the first embodiment. The BiSrCaCuO$_x$ superconductor is formed, in a thin layer, on a substrate made of, in this case, MgO, by applying a conventional RF magnetron sputtering method. Then, a plasma polymerized film is formed on the BiSrCaCuO$_x$ superconductor in chamber 1 shown in FIG. 1. In chamber 1, the plasma polymerized film is formed on the BiSrCaCuO$_x$ superconductor using CHF$_3$ as a source gas having a pressure of 133 Pa and a flow rate of 40 ml/min and applying RF power of 0.32 W/cm$^2$ for a plasma discharging time of 30 minutes.

Figure 10:
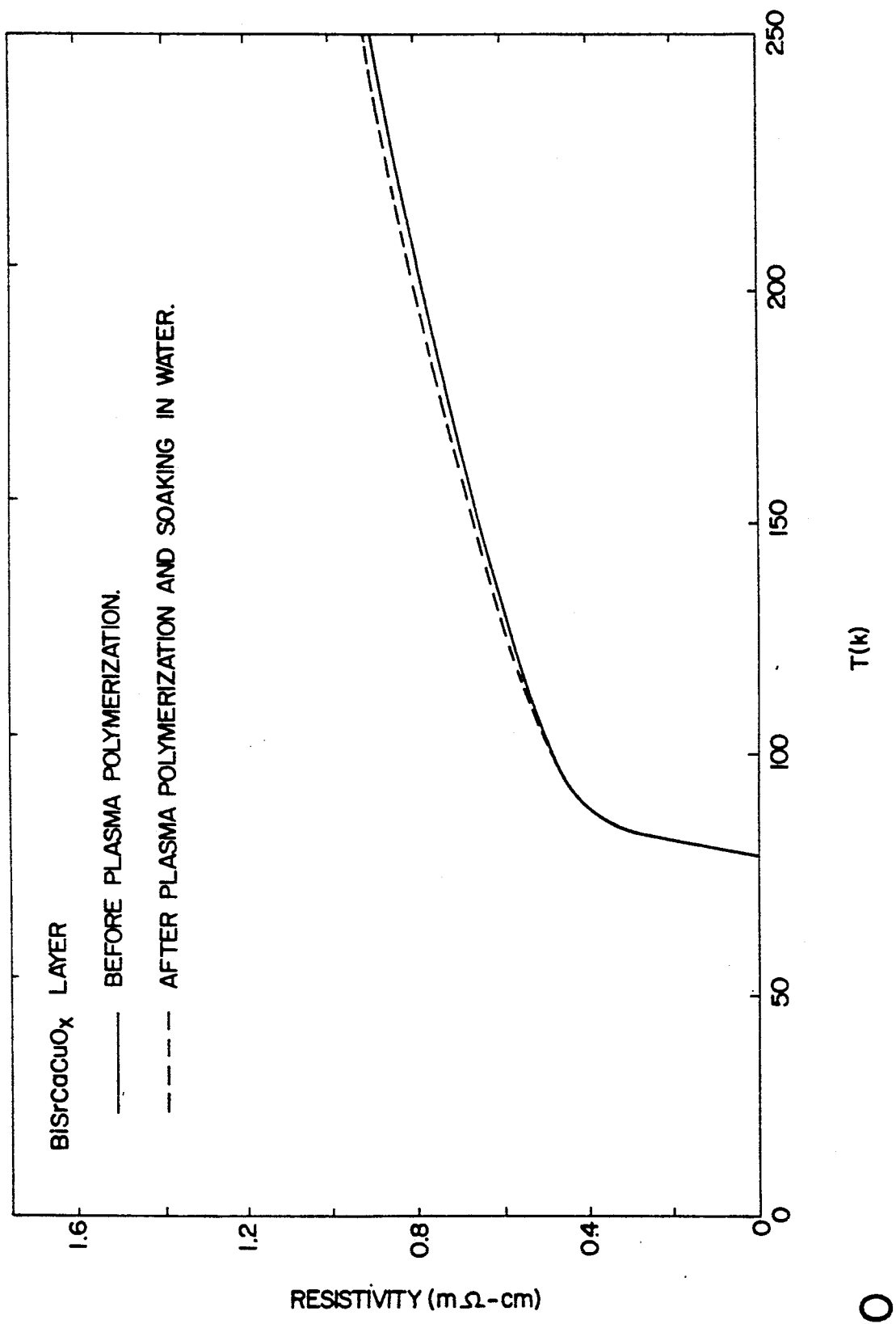
FIG. 10 is a graph showing the temperature dependence of the resistivity of a coated $BiSrCaCuO_x$ superconductor after soaking in water.
Figure 11:
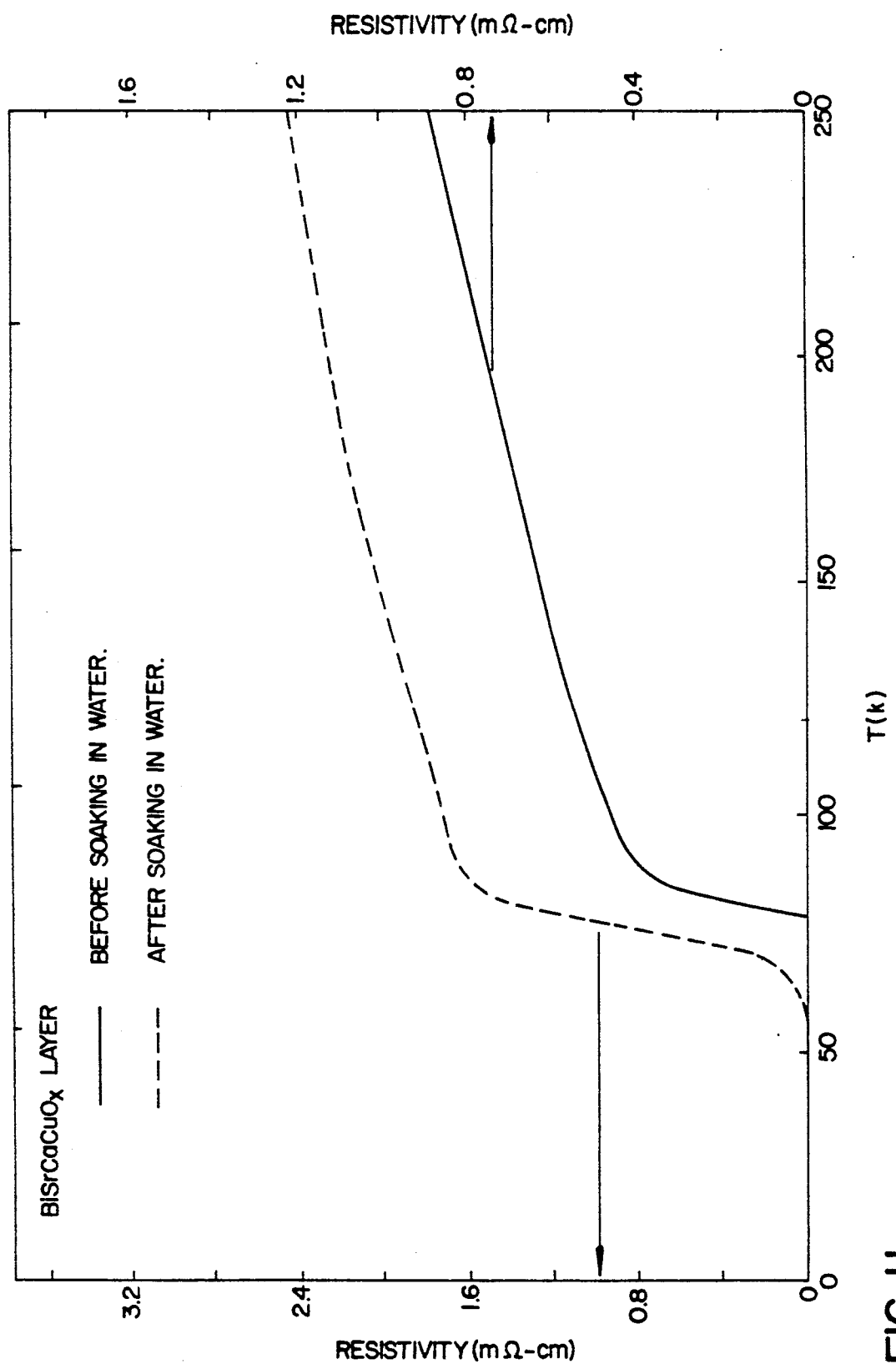
FIG. 11 is a graph showing the temperature dependence of the resistivity of an uncoated $BiSrCaCuO_x$ superconductor before and after soaking in water.

Similarly to the case of the first embodiment, the passivation effect of the plasma polymerized film, after soaking in water was examined, and the results of the examination that were obtained are shown in FIGS. 10 and 11.

FIG. 10 shows the relationship between the resistivity of the BiSrCaCuO$_x$ superconductor and the measuring temperature. In FIG. 10, the solid curve is the resistivity of the as-grown film uncoated BiSrCaCuO$_x$ superconductor having a Tc of 78K, and the dotted curve is the resistivity of the film coated BiSrCaCuO$_x$ superconductor which is coated with the plasma polymerized film in a thickness of 240 nm and has been soaked in 20° C. water for 5 hours. From FIG. 10, it can be concluded that the plasma polymerized film is effective for preventing deterioration due to humidity because as seen in FIG. 10, the increase of the resistivity is only 3% and the Tc value is not changed.

FIG. 11 also shows the relationship between the resistivity of BiSrCaCuO$_x$ superconductor and the measuring temperature. In FIG. 11, the solid curve is the resistivity of the as-grown film uncoated BiSrCaCuO$_x$ superconductor having a Tc of 78K, and the dotted curve is the resistivity of the film uncoated BiSrCaCuO$_x$ superconductor after having been soaked in 20° C. water for 1 hour. From FIG. 11, it can be concluded that if the BiSrCaCuO$_x$ superconductor is not passivated by the plasma polymerized film, the superconduction properties such as the Tc value and the resistivity of the BiSrCaCuO$_x$ superconductor are greatly deteriorated by soaking in water because as seen in FIG. 11, the Tc value is decreased to 57K and the resistivity is increased by two or three times, compared with the same properties of the BiSrCaCuO$_x$ superconductor not soaked in water.

The third embodiment of the present invention is concerned with a plasma polymerized film, however, in this case, the plasma polymerized film is provided not only for protecting the characteristics of the superconductor from the effects of soaking in water and/or annealing in air but also for recovering the characteristics once degraded.

In the third embodiment, the ceramic superconductor and the insulating substrate are the same as those in the first embodiment. The plasma polymerized film is formed on the ceramic superconductor in a state of a thin layer in the chamber 1 as described in the first embodiment in reference to FIG. 1, however, oxygen is mixed with the usual source gas of CHF$_3$. The conditions for performing the plasma treatment are as follows: the content of oxygen can be varied up to 50%, however, 10% in volume is preferable; the pressure of the source gas is 133 Pa; and the RF power is 0.32 W/cm$^2$.

Figure 12A:
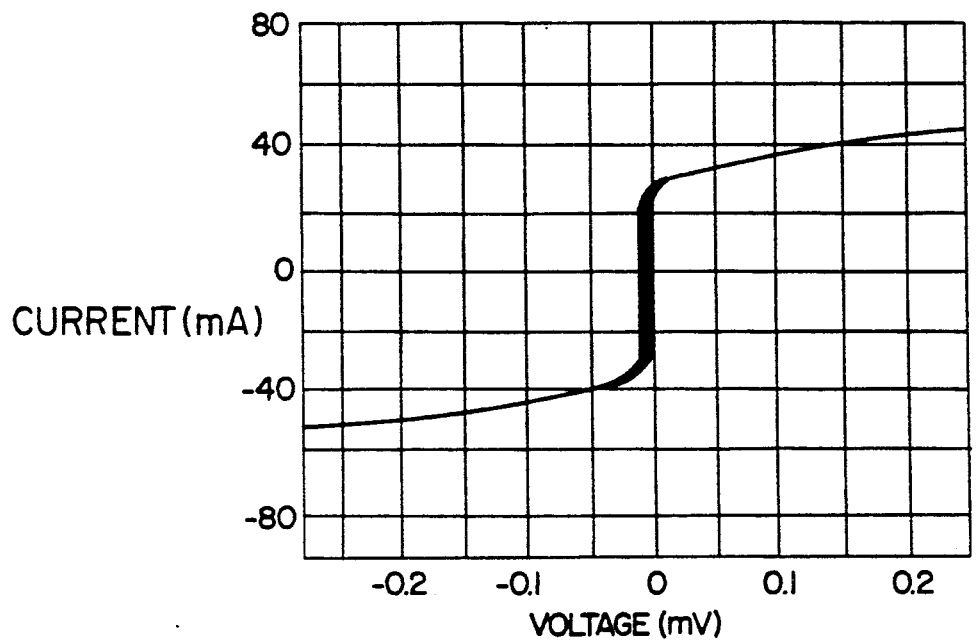
FIG. 12(a) is an oscilloscopic display showing the current-voltage characteristics of an uncoated $YBaCuO_x$ superconductor.
Figure 12B:
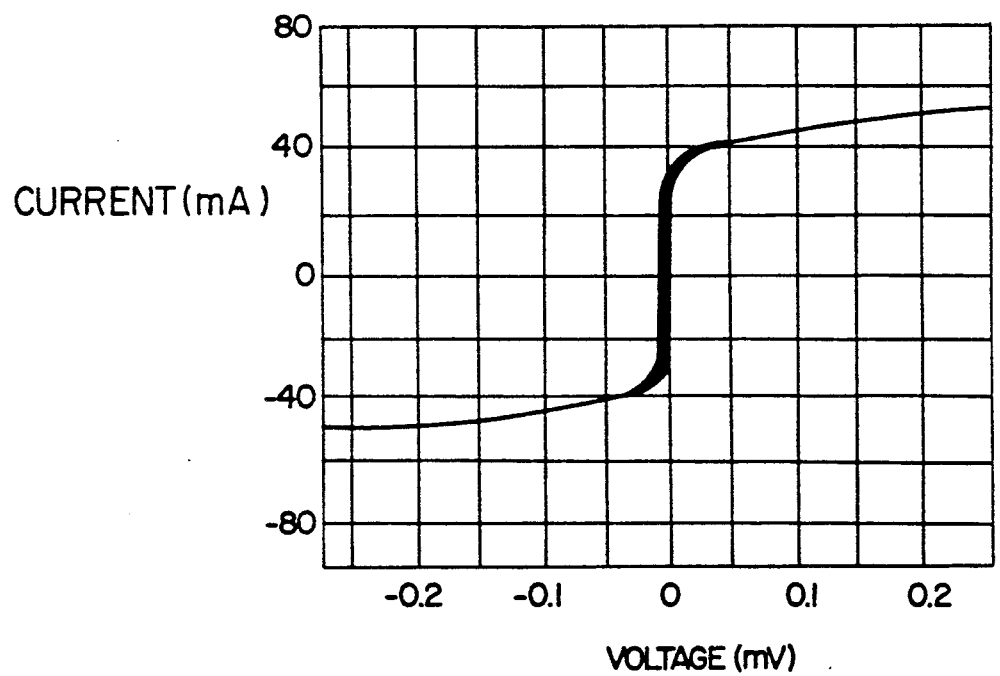
FIG. 12(b) is an oscilloscopic display showing the current-voltage characteristics of a coated $YBaCuO_x$ superconductor under a condition of mixing the source gas with oxygen.

The effect of mixing the oxygen in the source gas is shown in FIG. 12(a) and 12(b). FIG. 12(a) shows current-voltage characteristics of the film uncoated ceramic superconductor operating at 60K. However, the superconductor is in a state that several days have passed from the time when the superconductor was fabricated. FIG. 12(b) shows the current-voltage characteristics of the same ceramic superconductor as in FIG. 12(a) however the plasma polymerized film is formed thereon. In FIGS. 12(a) and 12(b), the current read at the vertical portion of respective curve is called a critical current. As can be seen from FIGS. 12(a) and 12(b), the value of the critical current increases from 24 to 27 mA after the plasma treatment, which is considered to result from the fact that the oxygen recovers the superconducting characteristics. This recovery phenomenon in a superconductor has been already known from laboratory work. However, the recovery phenomenon has not been realized in a practical use until the recovery phenomenon was combined with the plasma polymerized film formed on the ceramic superconductor as in the present invention. This is because the recovered superconducting characteristics are maintained only when the superconducting layer is passivated by the plasma polymerized film of the present invention.

The fourth embodiment is of an application of the plasma polymerized film to the fabrication process of a minute electrical device including the superconductor. In the fabrication process of the minute electrical device, a patterning process is indispensable to integrate the minute electrical device such as the Josephson junction device and the SQUID.

A patterning process of a ceramic superconducting film will be described with reference to FIGS. 13(a) to 13(b).

Figure 13A:
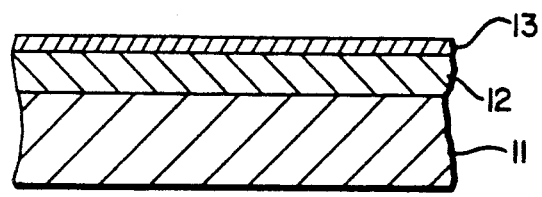
FIG. 13(a) is a schematic cross-sectional view of a sample of a ceramic superconductor ($YBaCuO_x$) layer formed on a substrate ($SrTiO_3$) and coated by the plasma polymerized film, for illustrating the initial step of the patterning process.
Figure 13B:
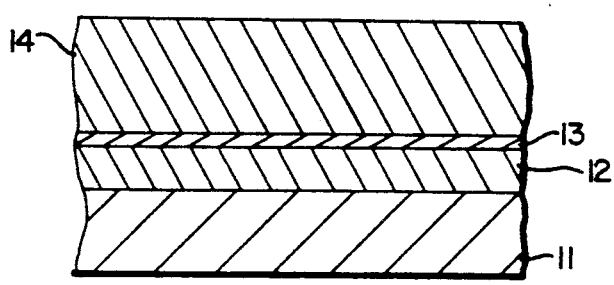
FIG. 13(b) is a schematic cross-sectional view of a sample provided by coating a resist film on the plasma polymerized film shown in FIG. 13(a).
Figure 13C:
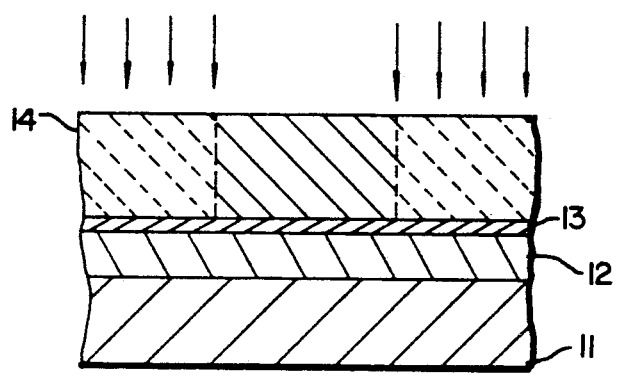
FIG. 13(c) is a schematic cross-sectional view of a sample provided by projecting a pattern onto the resist film shown in FIG. 13(b).
Figure 13D:
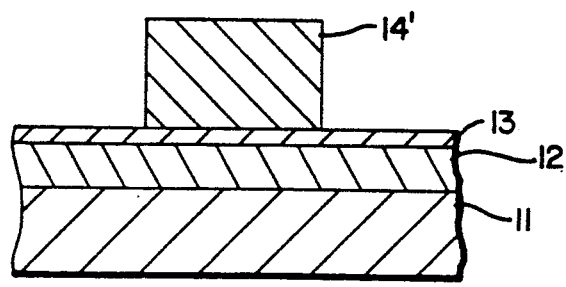
FIG. 13(d) is a schematic cross-sectional view of a sample provided by resist-coating and patterning the sample shown in FIG. 13(c).
Figure 13E:
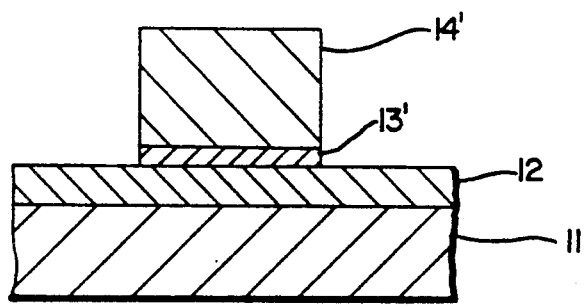
FIG. 13(e) is a schematic cross-sectional view of a sample, for illustrating a step of pattern etching performed on the plasma polymerized film shown in FIG. 13(d), by an argon ion etching method.

In FIG. 13(a), a superconductor (YBaCuO$_x$) layer 12 is formed on a substrate (SrTiO$_3$) 11 by a conventional method. As a substrate, Al$_2$O$_3$ or MgO is also useful. However, a superconductor made of YBaCuO$_x$ is usually formed on a substrate made of SrTiO$_3$, and a superconductor made of BiSrCaCuO$_x$ is usually formed on a substrate made of MgO because of the eliminating of problems due to lattice mismatching. The thickness of the YBaCuO$_x$ superconductor layer 12 is usually 100 to 200 nm. Then, a plasma polymerized film 13 is formed on the YBaCuO$_x$ superconductor layer 12 in the same way as described in the first embodiment. The thickness of the plasma polymerized film 13 is controlled so as to be in a range of from 0.5 to 100 nm by adjusting the pressure of the source gas, the RF power and the plasma discharging time. The thickness of the plasma polymerized film 13 is usually set to 10 to 50 nm. A resist film 14 of about 500 nm thickness is coated on the surface of the plasma polymerized film 13 by a spinner as shown in FIG. 13(b). Then, the resist film 14 is exposed using a photomask (not depicted) as indicated by arrows in FIG. 13(c). The exposed section is removed by a developer and then washed with water, producing a resist pattern 14' as shown in FIG. 13(d). The process of developing the exposed resist become possible because the plasma polymerized film 13 protects the ceramic superconduction layer from water and acid used as the developer.

Then, the plasma polymerized film 13 is pattern-etched by an argon ion etching technique. The argon ion etching can be performed in the chamber 1 of the plasma generating apparatus shown in FIG. 1, by exchanging the gas in the chamber 1. Typical conditions of the argon ion etching are that the pressure of argon is 1.3 Pa and the RF power of the plasma generating apparatus is in the range of 1.3 to 2.6 W/cm$^2$. In FIG. 3(e) a pattern etched plasma polymerized film 13' obtained by the method described above is shown.

Figure 13F:
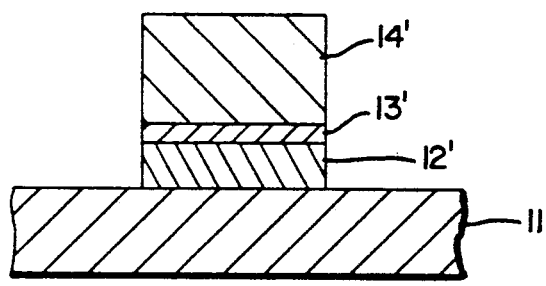
FIG. 13(f) is a schematic cross-sectional view of a sample, for illustrating the step of pattern etching performed on the ceramic superconductor layer shown in FIG. 13(e), by a reactive ion etching method.

Next, the YBaCuO$_x$ superconductor layer 12 is pattern-etched by a reactive ion etching technique, using tetrachloromethane (CCl$_4$). The reactive ion etching is also performed in the plasma generating apparatus. The reactive ion etching is performed under conditions such that the pressure of the CCl$_4$ is 6.5 Pa and the RF power is in the range of 0.3 to 0.6 W/cm$^2$. A pattern-etched YBaCuO$_x$ superconductor layer 12' is shown in FIG. 13(f). If a wet etching technique is used to pattern-etch the YBaCuO$_x$ superconductor layer 12', the peripheral side of the YBACuO$_x$ superconductor layer 12' is also etched. However, this is usually not important because the superconductor layer 12' is very thin.

Figure 13G:
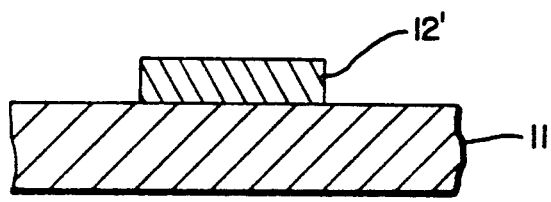
FIG. 13(g) is a schematic cross-sectional view of the patterned ceramic superconductor layer, for illustrating the final step of removing the resist film and the plasma polymerized film in FIG. 13(f).

Finally, the pattern-etched resist film 14' and the pattern-etched plasma polymerized film 13' are removed by applying oxygen plasma ashing and argon ion etching, leaving the patterned YBaCuO$_x$ superconductor layer 12'. The conditions of the oxygen plasma ashing are that the pressure of the oxygen is 13 Pa and the RF power is in the range of 0.3 to 0.6 W/cm$^2$. Thus the patterning of the YBaCuO$_x$ superconductor is accomplished as shown in FIG. 13(g).

In all embodiments, the CHF$_3$ gas is typically used to fabricate the plasma polymerized film, however, a C$_2$F$_4$ gas or a mixed gas of a CF$_4$ gas and an H$_2$ gas are also useful.

Further, the following gases, that is, members of the fluoroolefin group such as fluoromethane, fluoroethane and hexafluoropropylene and aromatic fluorohydrocarbons such as vinylidene fluoride, vinyl fluoride and benzotrifluoride can be used as a source gas under the same conditions as those of the CHF$_3$ gas.

What is claimed is:

1. A superconductor device comprising:
    a ceramic superconductor which comprises one of lanthanum-strontium-copper oxide, yttrium-barium-copper oxide and bismuth-strontium-calcium copper oxide; and
    a plasma polymerized film which comprises a polymerized material containing at least one of monofluorocarbon bonds, difluorocarbon bonds and trifluorocarbon bonds formed on a surface of said superconductor such that said plasma polymerized film protects the superconductive properties of said ceramic superconductor from deterioration.

2. A superconductor device according to claim 1, wherein said ceramic superconductor is formed as a layer on a substrate.

3. A superconductor device according to claim 2, wherein said plasma polymerized film further comprises fluorides chemically bonded with elements of said ceramic superconductor layer, at an interface existing between said plasma polymerized film and said ceramic superconductor layer.

4. A superconductor device according to claim 2, wherein said plasma polymerized film has a thickness between 0.5 and 100 nm.

5. A superconductor device according to claim 2, wherein said ceramic superconductor layer has a thickness between 100 and 200 nm.

* * * * *